United States Patent
Kuo et al.

(10) Patent No.: US 6,999,532 B2
(45) Date of Patent: Feb. 14, 2006

(54) DECODING CIRCUIT AND METHOD OF VITERBI DECODER

(75) Inventors: Hung-Chenh Kuo, Hsinchu (TW); Wen-Yi Wu, Chu-Pei (TW)

(73) Assignee: Media Tek Inc., Hsin Chu (TW)

(*) Notice: Subject to any disclaimer, the term of this patent is extended or adjusted under 35 U.S.C. 154(b) by 793 days.

(21) Appl. No.: 10/020,160

(22) Filed: Dec. 18, 2001

(65) Prior Publication Data

US 2003/0007578 A1   Jan. 9, 2003

(30) Foreign Application Priority Data

Dec. 22, 2000 (TW) ............................. 89127633 A

(51) Int. Cl.
*H04L 27/06* (2006.01)
*H04L 5/12* (2006.01)
*H03M 13/03* (2006.01)

(52) U.S. Cl. ...................... 375/341; 375/262; 714/795
(58) Field of Classification Search ................ 375/341, 375/262–265, 285, 290; 341/59, 59.14; 369/59, 369/59.19; 714/794, 795
See application file for complete search history.

(56) References Cited

U.S. PATENT DOCUMENTS

| | | | | |
|---|---|---|---|---|
| 5,563,864 A | * | 10/1996 | Kobayashi et al. | 369/59.22 |
| 5,940,416 A | * | 8/1999 | Nishiya et al. | 714/795 |
| 5,970,104 A | * | 10/1999 | Zhong et al. | 375/341 |
| 6,373,413 B1 | * | 4/2002 | Yoshinaka | 341/94 |
| 6,646,575 B2 | * | 11/2003 | Wu et al. | 341/59 |
| 6,653,951 B2 | * | 11/2003 | Kuo et al. | 341/59 |
| 6,654,929 B1 | * | 11/2003 | Kamada | 714/795 |
| 6,697,442 B1 | * | 2/2004 | Todoroki | 375/341 |
| 6,711,213 B2 | * | 3/2004 | He et al. | 375/262 |
| 6,904,559 B2 | * | 6/2005 | Shieh | 714/795 |

* cited by examiner

*Primary Examiner*—Emmanuel Bayard
*Assistant Examiner*—Lawrence B. Williams
(74) *Attorney, Agent, or Firm*—Birch, Stewart, Kolasch & Birch, LLP

(57) ABSTRACT

The invention provides a decoding circuit and a decoding method of a Viterbi decoder. The decoding circuit of the Viterbi decoder includes a branch metric unit, an add-compare-select unit and a path memory unit. The path memory unit includes a data string controller, a trace write-in register array, an idling register array and a decoding register array. In this invention, a run length limited code is used for effectively solving the problem of generating a complicated trellis diagram after the trellis diagram of the Viterbi decoder is subjected to a longitudinal arrangement. In addition, the register array can perform other operations at different times. Accordingly, a high decoding speed of the Viterbi decoder can be achieved without requiring a lot of registers for data processing.

20 Claims, 17 Drawing Sheets

4 to 6 times of the length of channel memory

DECODING CIRCUIT AND METHOD OF VITERBI DECODER

BACKGROUND OF THE INVENTION

A. Field of the Invention

The invention relates to a decoding circuit and a decoding method of a Viterbi decoder in a Partial Response Maximum Likelihood (PRML) system of an optical disc. Particularly, the invention relates to a decoding circuit and a decoding method for a Viterbi decoder in a PRML system of an optical disc wherein a run length limited code (RLL Code) is used for effectively simplifying the complicated trellis diagram of the Viterbi decoder after longitudinal arrangement without a lot of registers for data processing.

B. Description of the Related Art

In a PRML system such as a digital versatile disc (DVD) or the like, a trellis diagram can be used for describing the property of a transmission channel with a memory. For example, an input signal EFM (eight to fourteen modulation) of a DVD channel is a binary signal and the channel memory length is 2. Accordingly, the trellis diagram has four states each having two branches. Thus, each state has eight branches and it means that the signal outputted from the transmission channel at each time is one of the eight possible signals. As shown in FIG. 1A which is a schematic illustration showing the channel model, the values of the eight possible signals can be obtained from the channel model by substituting the (1/−1) as the "current input" into the following equation:

("current input"+$k1$*"previous input in the first memory"+$k2$*"previous input in the second memory")

In FIG. 1A, k1 and k2 represent the characteristic of the channel. The values of k1 and k2 may be given in advance. Then, a shaping filter, which is a partial response equalizer, is used for making the characteristic of the whole channel approach the values. Alternatively, in a method of signal level estimation, the values of k1 and k2 are directly estimated without changing the characteristic of the channel. No matter which method is adopted, the corresponding values on each branch of the trellis diagram in FIG. 1B will be determined after the values of k1 and k2 are determined.

FIG. 2 is a block diagram showing a Viterbi decoder. In FIG. 2, a Viterbi decoder 200 includes a branch metric unit 202, an ACS (add-compare-select) 204, and a path memory unit (PMU) 206. The branch metric unit 202 receives a digital signal outputted from a pre-stage converter (not shown) and a reference level outputted from a reference-level generating unit (not shown) and computes a branch metric BM. The ACS 204 receives the branch metric BM and performs the operations of adding, comparing and selecting according to the branch metric so as to obtain a path metric PM. The path memory unit 206 receives the path metric PM outputted from the ACS 204 and performs the operations of converging, merging and decoding to obtain a decoded signal, which is outputted to a next-stage demodulator (not shown). The Viterbi decoder 200 is further described in detail in the following.

FIG. 3 is a schematic illustration showing a decoding deduction for the Viterbi decoder. In FIG. 3, if the Viterbi decoder 200 continuously receives three signals R1, R2 and R3 and will find out the most possible corresponding signal, it firstly computes (performed by the branch metric unit 202 in FIG. 2) the branch metric with respect to each branch in the trellis diagram. The computation method is usually of computing the square value of the signal difference or the absolute value of the signal difference, for example, BM00-00=$[R1-(-1.8)]^2$ or $|R1-(-1.8)|$. The so-called "path metric of a certain path" means the addition result of all branch metrics corresponding to all branches of this path. For example, the path metric of the path from State00 at 1T, State00 at 2T, state01 at 3T, and finally to State11 at 4T, indicated by the bold lines in FIG. 3, is "BM00-00=BM00-01+BM01-11".

Of course, under the general condition, the path will never be so short. The above-mentioned path before State00 at 1T should travel a certain path. Thus, the actually correct path metric of the path should be "the path metric accumulated to State00 at 1T in this path"+"BM00-00+BM00-01+BM01-11". It can be understood from the trellis diagram that each path crosses with one another on each state, and that the variations after each state for any arbitrary path are all the same. Therefore, Viterbi found that an optimum path would be determined finally as long as the optimum path at each state is selected for continuous extension. However, the degree of operating complication can be greatly decreased. The operation of "selecting an optimum path at each state for continuous extension" is known as a survivor path selection and the selected path is a survivor path.

In FIG. 3, it describes how the survivor path at State00 at 2T is selected from the survivor path at State00 at 1T and the survivor path at State10 at 1T. Referring to FIG. 3, the survivor metric SM00 at 2T at State00 at 2T is obtained from the following equation:

$SM$00 at 2T=min{[$SM$00 at 1T+$BM$00-00]; [$SM$10 at 1T+$BM$10-00]}

This equation is performed by the ACS unit. Since a feedback loop exists in the ACS unit (the survivor metric of each state has to be re-calculated), it is difficult to implement a high-speed Viterbi decoder. Thus, the ACS becomes the bottleneck of speed.

According to the deduction of the Viterbi decoder, after each opeartion of the ACS, an optimum path can be surely obtained. Thus, as long as each survivor path is continuously recorded, the optimum path can be obtained by transforming the record of the optimum survivor path after the whole data are decoded. However, there are two disadvantages in this case. First, the hidden decoding path is too long. Second, if the path is too long, the capacity of the hardware for recording will be relatively great (the hardware is called a path memory unit).

Referring to FIG. 4, which is a schematic illustration showing the convergence in the trellis diagram using the algorithm of the Viterbi decoder, the Viterbi algorithm possesses a property that each survivor path has 99% opportunity to merge with its pervious path after the trellis extending four to six times of the length of the channel memory. Therefore, it is only necessary for the path memory unit to keep the latest data within four to six times of the channel memory for selection. The forgone data can be discarded after each decoding operation. Thus, the operation of the path memory unit can be completed using limited resources. The commonly used methods include the shuffle-exchange and trace-back methods.

FIG. 5 shows the trellis diagram and a block diagram of the shuffle-exchange method. In FIG. 5, the operation principle of the shuffle-exchange is to provide a set of memories (register arrays are often used) corresponding to each state on the trellis diagram. For example, the state "00" corresponds to the register array 502, the state "01" corresponds to the register array 504, the state "10" corresponds to the register array 506, and the state "11" corresponds to the register array 508. These register arrays are used for recording the survivor paths of the states.

That is, the survivor paths recorded in each state at a specific time are continuously replaced by the survivor paths recorded in each state at a previous time as well as the newly decision bits (the values of −1.8, −0.8, 0.2, 1.2, −1.2, −0.2, 0.8, 1.8 as shown in FIG. 5). As shown in FIG. 5, when the received signals passes about 4 to 6 times of the length of the channel memory, it can be assumed that all paths have been converged to one point. Thus, the converged values can be sent as the decoded signals. Consequently, the length of each register array only has to be about 4 to 6 times of the channel memory.

FIG. 6 shows a trellis diagram and a block diagram of a trace-back method. As shown in FIG. 6, the operation principle of the trace-back method is to store the decision bits of each state (at each time) into a "regular memory" such as a RAM. That is, each state regularly stores its decision bits. For example, the decision bits of the state "0" is stored in a first row of the RAM, the decision bits of the state "01" is stored in a second row of the RAM, and so on. No interaction exists between any two states. After 4 to 6 times of the length of the channel memory is passed, as shown in FIG. 4, a converged point (root) appears. Therefore, from an arbitrary state, the stored decision bits can be used for deriving a previous state and finding the root by the trace-back method.

However, in the actual implemenattion, it is not possible to perform such a trace-back operation for finding each root. Instead of this trace-back operation, a method of batch operation is used for arranging the data to the configuration of "finding the root, and then finding a piece of data sequentially". This method can be described by four basic operations of V (write-in), T (trace), I (idle), and D (decode).

FIG. 7 is a schematic illustration showing the relationship between the time and space of the four basic operations in the trace-back method. Referring to FIG. 7 along the vertical direction at first, the memory M1 regularly writes-in (V operation) the decision bits of each state at T1. Next, the trace-back operation (T operation) is performed from a certain state to solve the root at T2. When the root is found, the operation is transferred to the memory M4 (adjacent blocks are recorded on the trellis and then the block M4 decodes (D operation) the decision bits after the root). At T3, the data of the memory M1 is temporarily idled (I operation), because it is not a long time since the previous write-in (V) process is performed. The data within the memory M1 can be regarded as being merged only after the trellises are merged. At this time, the root generated from the memory M2 is given to the memory M1 for performing the decoding process (D operation).

Again, referring to FIG. 7 along the horizontal direction, at certain timing, each memory block performs the four basic operations of V, D, I, and T. The advantage of the trace-back method is the regular operation thereof. Since each state in the same stage is stored individually, the difficulty of layout is decreased. The disadvantage of the trace-back method is that it is usually implemented using RAMs. Thus, it is allowable for the application of DVD players but is not allowable in DVD ROMs due to its slow speed. If registers are used for increasing the speed, a lot of hardware costs should be paid because four blocks are processing the data simultaneously in the trace-back method. Thus, this method is not suitable for high-priced memories.

SUMMARY OF THE INVENTION

It is therefore an object of the invention to provide a decoding circuit and a decoding method of a Viterbi decoder capable for solving the complicated trellis diagram after the trellis diagram of the Viterbi decoder is subjected to a longitudinal arrangement. In addition, a high decoding speed of the Viterbi decoder can be achieved without requiring a lot of registers for data processing.

The invention provides a decoding method for a Viterbi decoder. The Viterbi decoder has a branch metric unit, an add-compare-select unit and a path memory unit. The method includes the following steps. First, the Viterbi decoder performs a longitudinal arrangement with respect to a trellis diagram corresponding to the Viterbi decoder so as to obtain a longitudinal arrangement trellis diagram. Next, the Viterbi decoder processes the longitudinal arrangement trellis diagram according to a RLL code so as to obtain a RLL trellis diagram. Then, the branch metric unit computes a current input branch-metric-value according to the RLL trellis diagram. Furthermore, the add-compare-select unit computes the current input branch-metric-value, a next input branch-metric-value and a current state so as to obtain a next state value. Next, the Viterbi decoder records results computed by the add-compare-select unit in the path memory unit so as to obtain a survivor path. Then, the Viterbi decoder decodes the recorded survivor path.

The invention provides another decoding method for a Viterbi decoder. The Viterbi decoder has a branch metric unit, an add-compare-select unit and a path memory unit. The path memory unit includes a decoding register array, a trace write-in register array, an idling register array and an add-compare-select unit. The method includes the following steps. First, the Viterbi decoder creates a trellis diagram corresponding to the Viterbi decoder. Next, the Viterbi decoder performs a longitudinal arrangement with respect to the trellis diagram corresponding to the Viterbi decoder so as to obtain a longitudinal arrangement trellis diagram. Then, the Viterbi decoder processes the longitudinal arrangement trellis diagram according to a RLL code so as to obtain a RLL trellis diagram. Next, the branch metric unit computes a branch metric value according to the RLL trellis diagram. Furthermore, the add-compare-select unit computes a current input branch-metric-value, a next input branch-metric-value and a current state so as to obtain a next state value. Next, the add-compare-select unit sets a current output decision bit and a next output decision bit according to only the next state value. Moreover, the Viterbi decoder records a decision bit on a previous state value and the current state value according to the current output decision bit and the next output decision bit. Next, the Viterbi decoder decides a relationship between the current state and the decision bit and writes the decision bit into the suitable state value. Then, the decision bit is outputted from the add-compare-select unit to the trace write-in register array and tracing for obtaining a merged value, wherein the decoding register array becomes the idling register array when the decision bit stored in the decoding register array reaches a predetermined quantity. Finally, the Viterbi decoder decodes the decision bit stored in the previous idling register array according to the merged value The invention also provides a decoding circuit of a Viterbi decoder. The decoding circuit includes a branch metric unit, an add-compare-select unit and a path memory unit. The branch metric unit is used for computing a branch metric value and outputting the branch metric value to the add-compare-select unit. The add-compare-select unit is used for computing an optimum path of a state value according to the branch metric value and outputting a decision bit. The path memory unit includes a data string controller, a trace write-in register array, an idling register array, and a decoding register array. The data string controller is used for receiving the decision bit outputted from the add-compare-select unit and deciding the direction of the output string of the decision bit. The trace write-in register array is used for receiving the decision bit outputted from the data string controller and tracing for obtaining a merged value. The idling register array is used for decoding the merged value obtained from the tracing of the trace write-in register array. The decoding register array is used for decoding the decision bit stored in the decoding register array according to the merged value obtained by the tracing.

Consequently, the invention provides a decoding circuit and a method for a Viterbi decoder. In this invention, a RLL code is used for effectively solving the problem of generating a complicated trellis diagram after the trellis diagram of the Viterbi decoder is subjected to a longitudinal arrangement. Therefore, the ACS can perform adding and comparing operations in parallel, and the register array can perform other operations at different time. Accordingly, a high decoding speed of the Viterbi decoder can be achieved without requiring a lot of registers for data processing in the ACS and PMU.

BRIEF DESCRIPTION OF THE DRAWINGS

These and other objects and advantages of the present invention will become apparent by reference to the following description and accompanying drawings wherein:

FIG. 17C shows another data string for the trace-back method; an

DETAILED DESCRIPTION OF THE INVENTION

Figure 3:
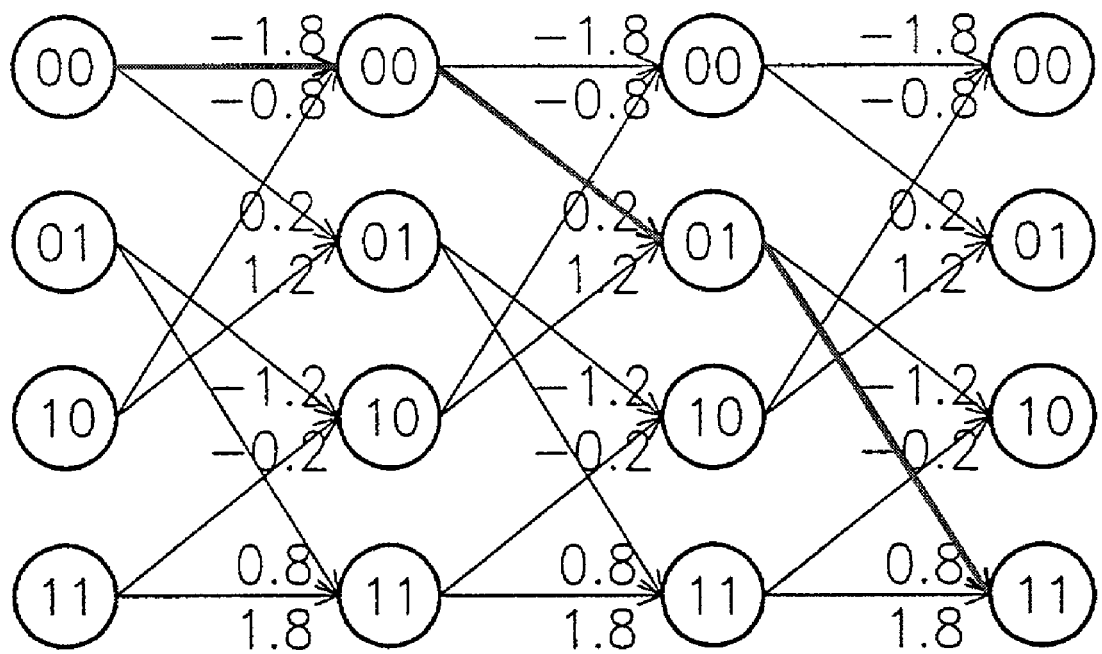
FIG. 3 shows a decoding deduction for the Viterbi decoder.
Figure 3:
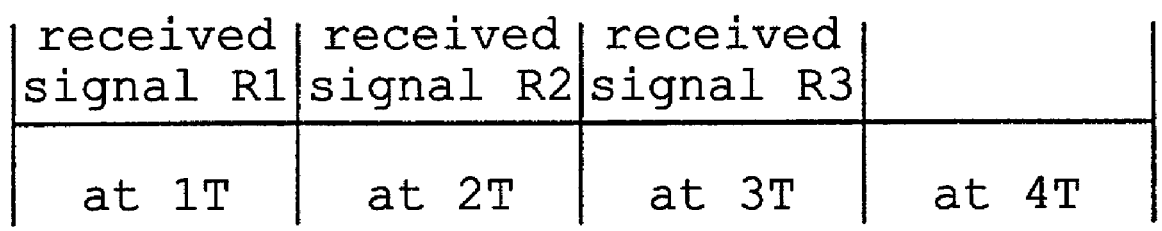
Figure 4:
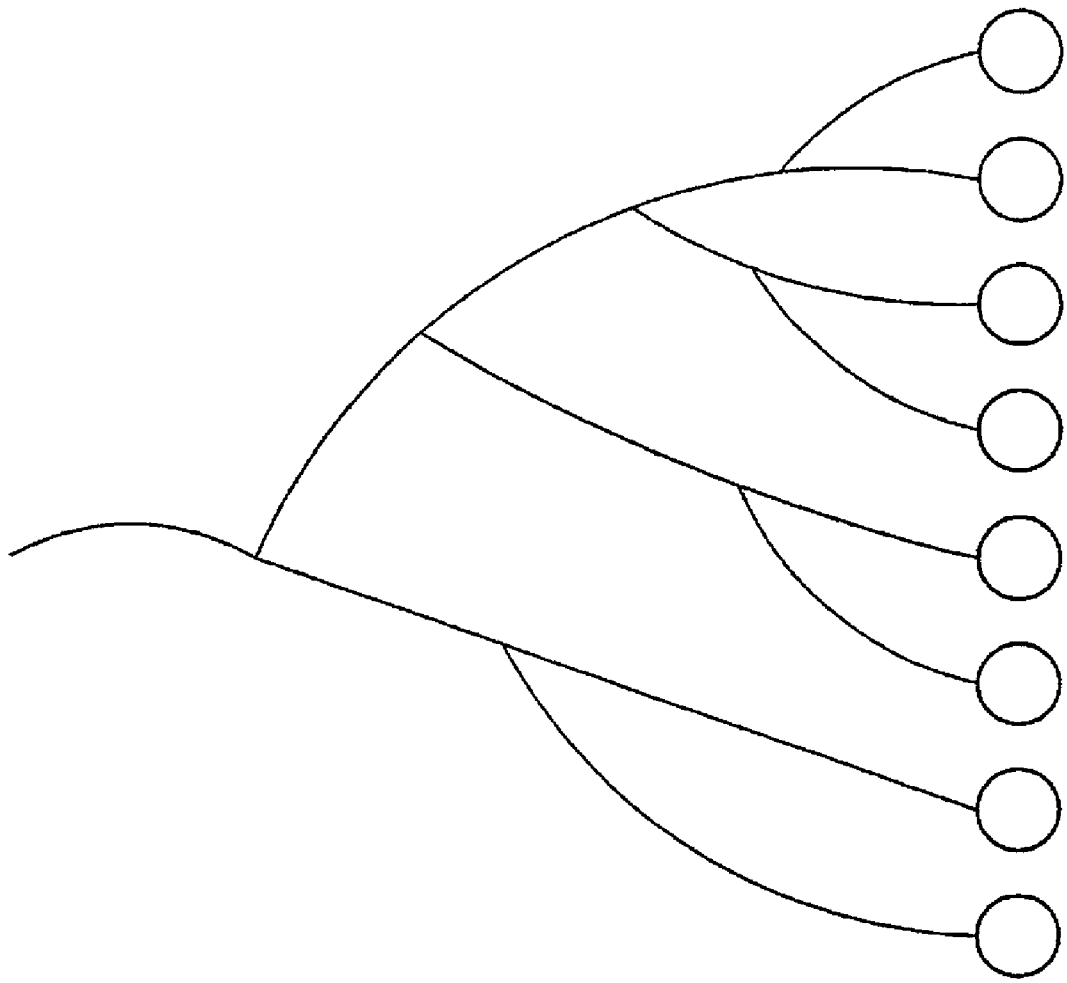
FIG. 4 a schematic illustration showing the convergence in the trellis diagram using the algorithm of the Viterbi decoder.
Figure 5:
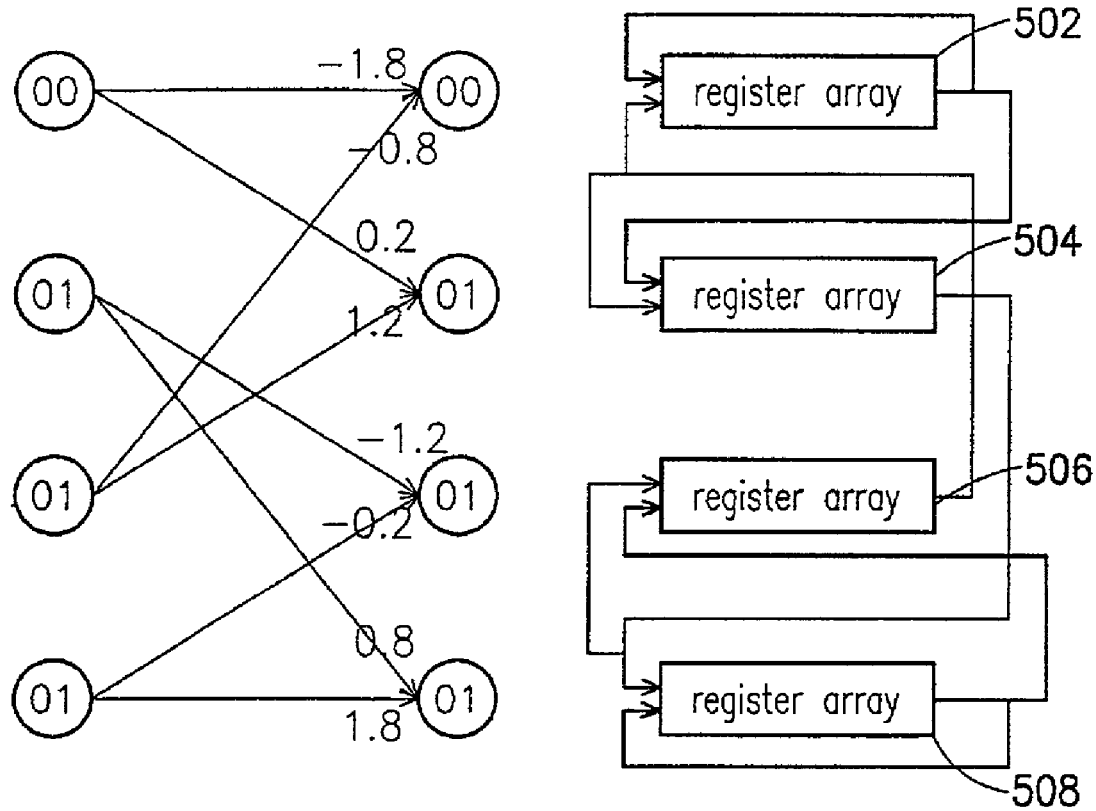
FIG. 5 shows a trellis diagram and a block diagram for a shuffle-exchange method.
Figure 6:
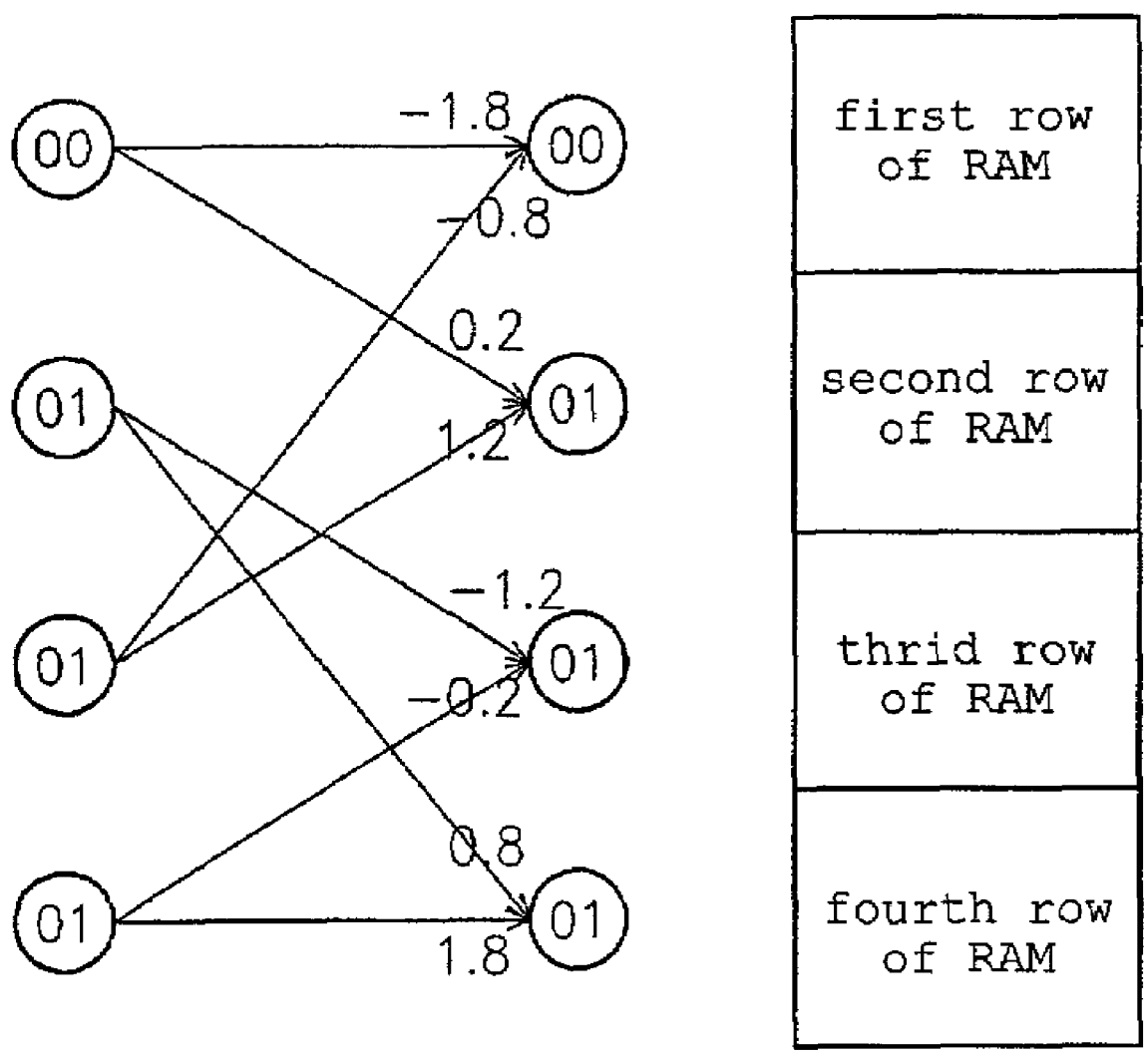
FIG. 6 shows a trellis diagram and a block diagram for a trace-back method.
Figure 7:
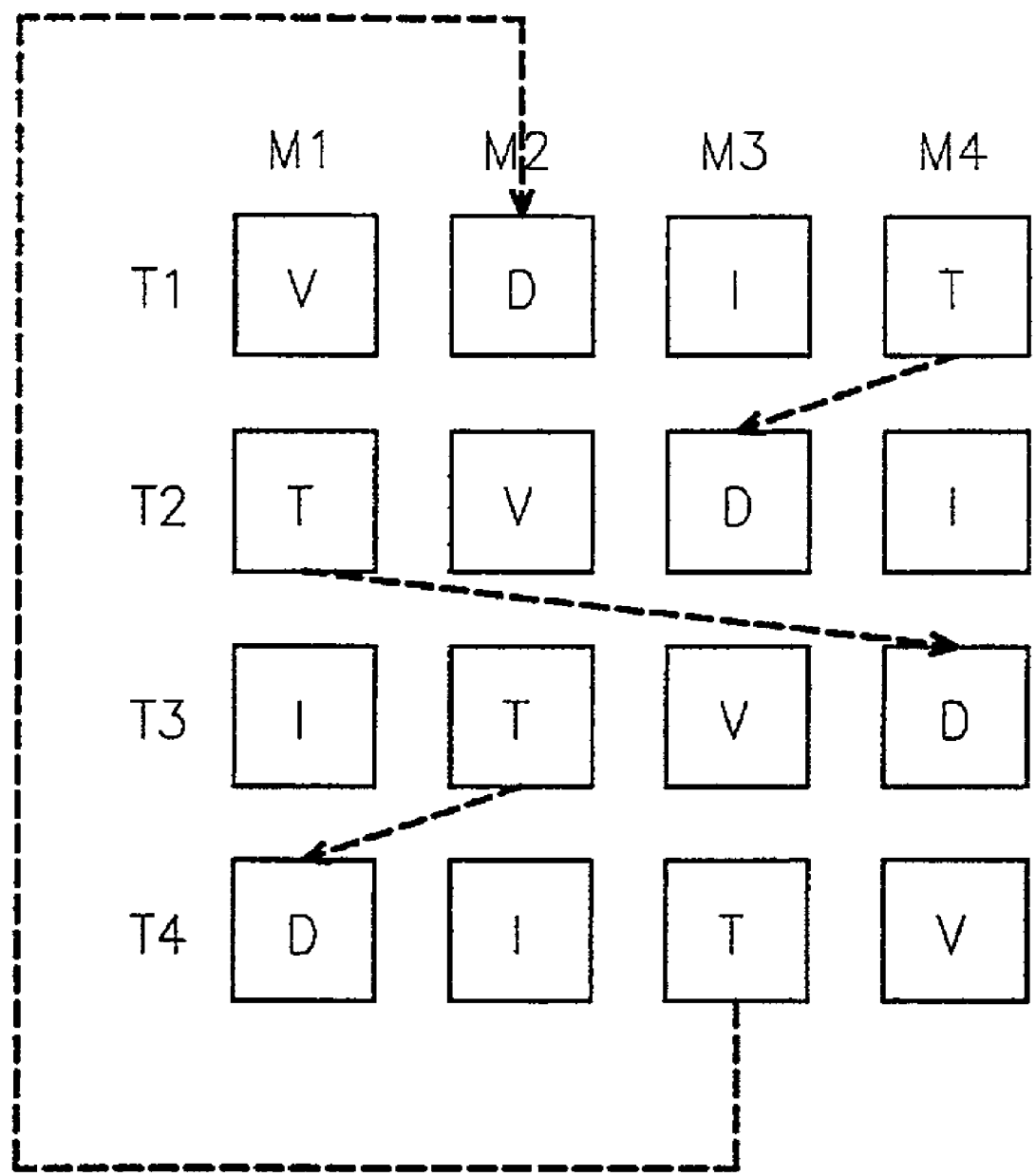
FIG. 7 is a schematic illustration showing the relationship between the time and space of the four basic operations in the trace-back method.
Figure 8:
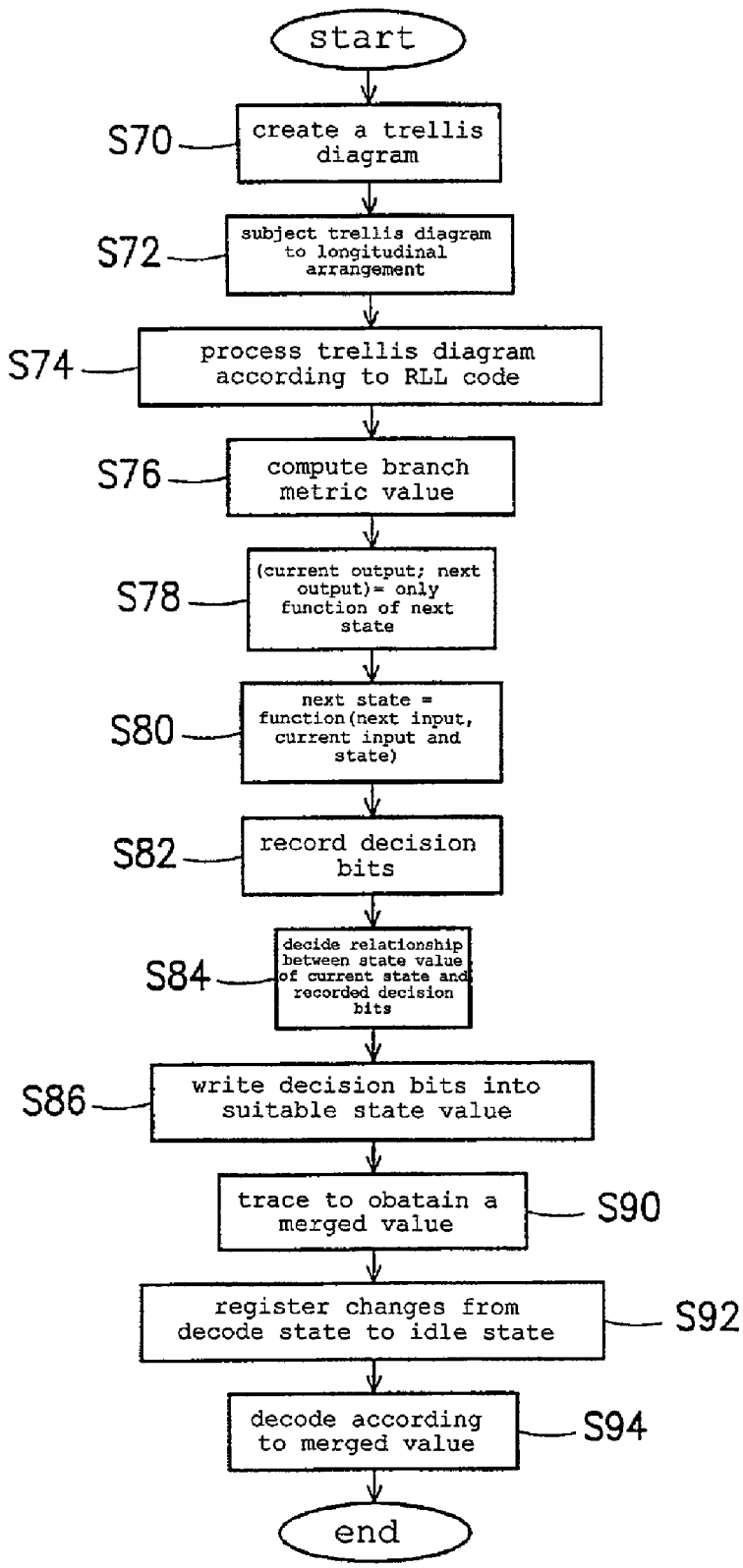
FIG. 8 is a flow chart showing the method for the Viterbi decoder of the invention.
Figure 9A:
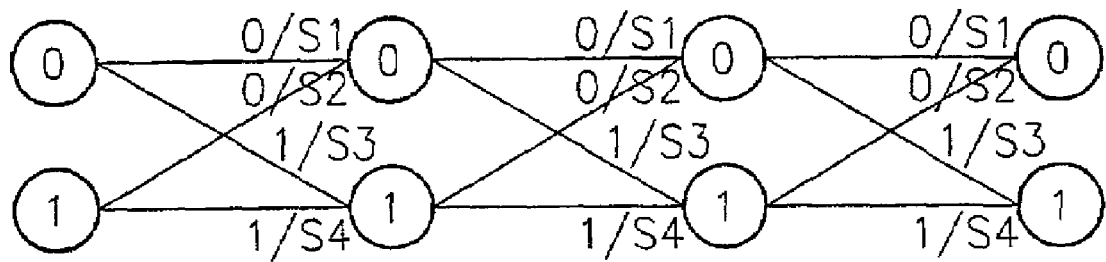
FIG. 9A shows an original trellis diagram.
Figure 9B:
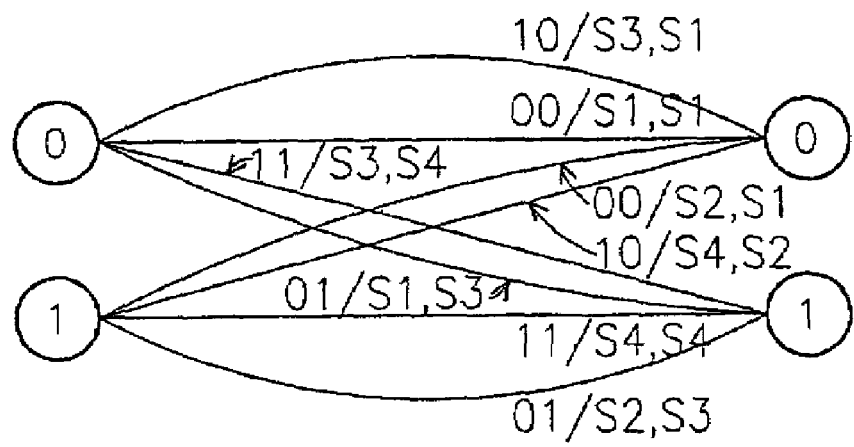
FIG. 9B is a schematic illustration showing that a transverse arrangement is performed in the original trellis diagram.

FIG. 8 is a flow chart showing the method for the Viterbi decoder of the invention. As shown in FIG. 8, a trellis diagram (as shown in FIG. 3) corresponding to the Viterbi decoder is first created in step S70. In order to overcome the bottleneck for the ACS, the trellis diagram of the Viterbi decoder is re-arranged by the re-arranging method including a transverse arrangement and a longitudinal arrangement. Taking the original trellis diagram shown in FIG. 9A and n=2 as an example, FIG. 9B shows a transverse arrangement performed in the original trellis diagram. The so-called transverse arrangement is to merge the trellises. Although the bottleneck of ACS still exists, the time of the bottleneck is lengthened from 1T to nT. Thus, the overall speed limitations of the Viterbi decoder can be eased.

Figure 9C:
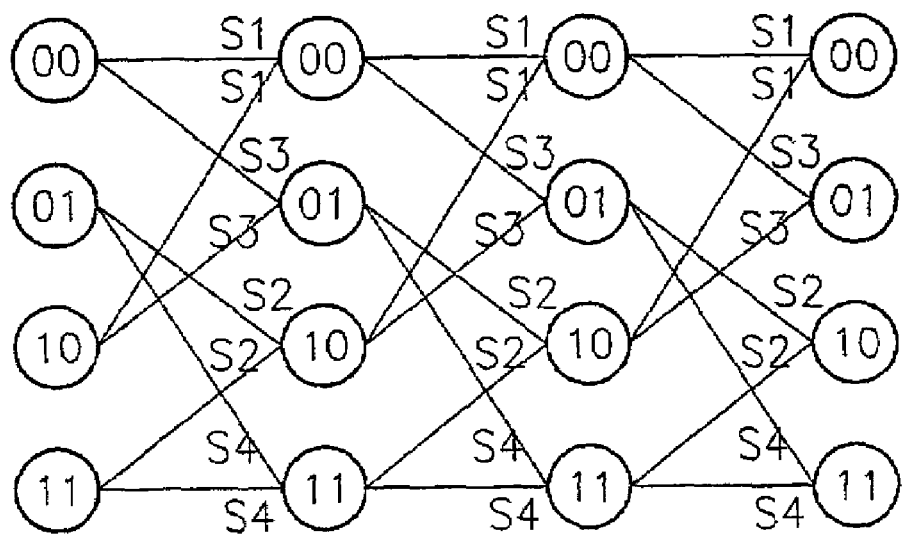
FIG. 9C is a schematic illustration showing that a longitudinal arrangement is performed in the original trellis diagram.

FIG. 9C is a schematic illustration showing that a longitudinal arrangement is performed in the original trellis diagram. In FIG. 9C, the trellis diagram corresponding to the Viterbi decoder is subjected to a longitudinal arrangement in the step S72. Since the number of states of the longitudinal arrangement trellis diagram increases exponentially with respect to 2, which makes the longitudinal arrangement trellis diagram complicated, RLL codes are used for limiting the presence of some states. Thus, the longitudinal arrangement trellis diagram can be computed to obtain a RLL trellis diagram in step S74.

Figure 10:
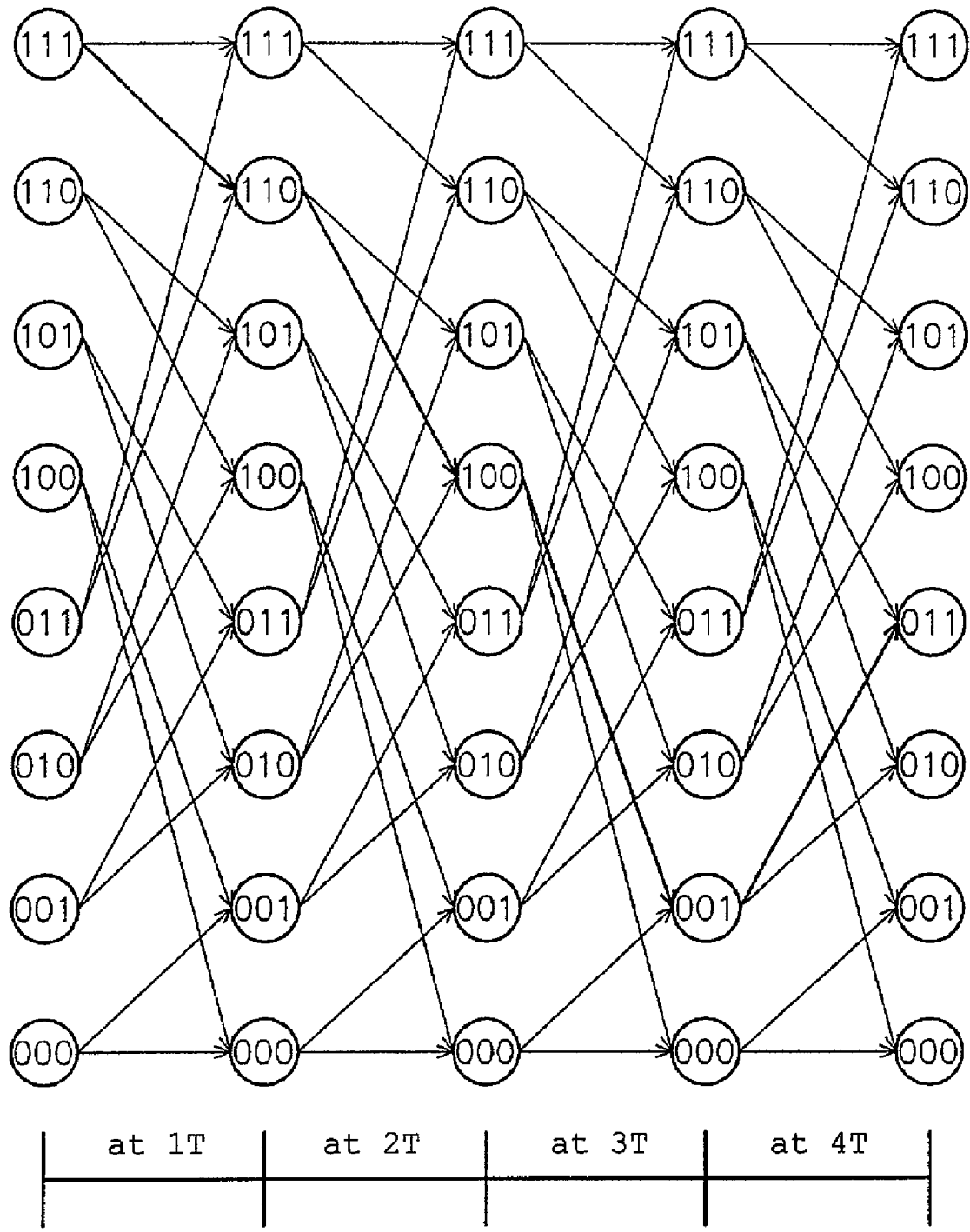
FIG. 10 shows a trellis diagram wherein the number of the channel memory of the binary inputs is 3.
Figure 11:
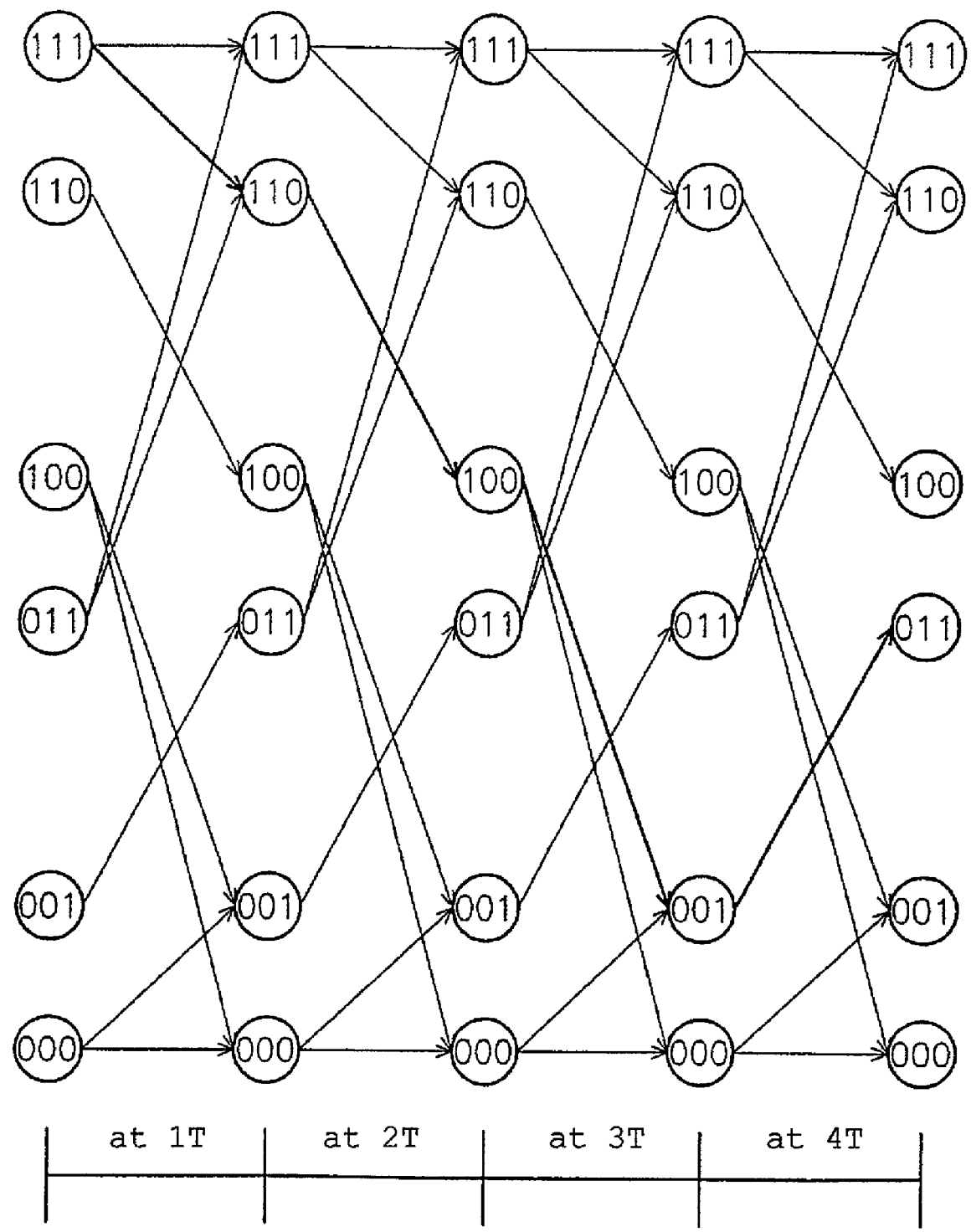
FIG. 11 shows a trellis diagram under the limitation of RLL (2,10) codes.
Figure 12:
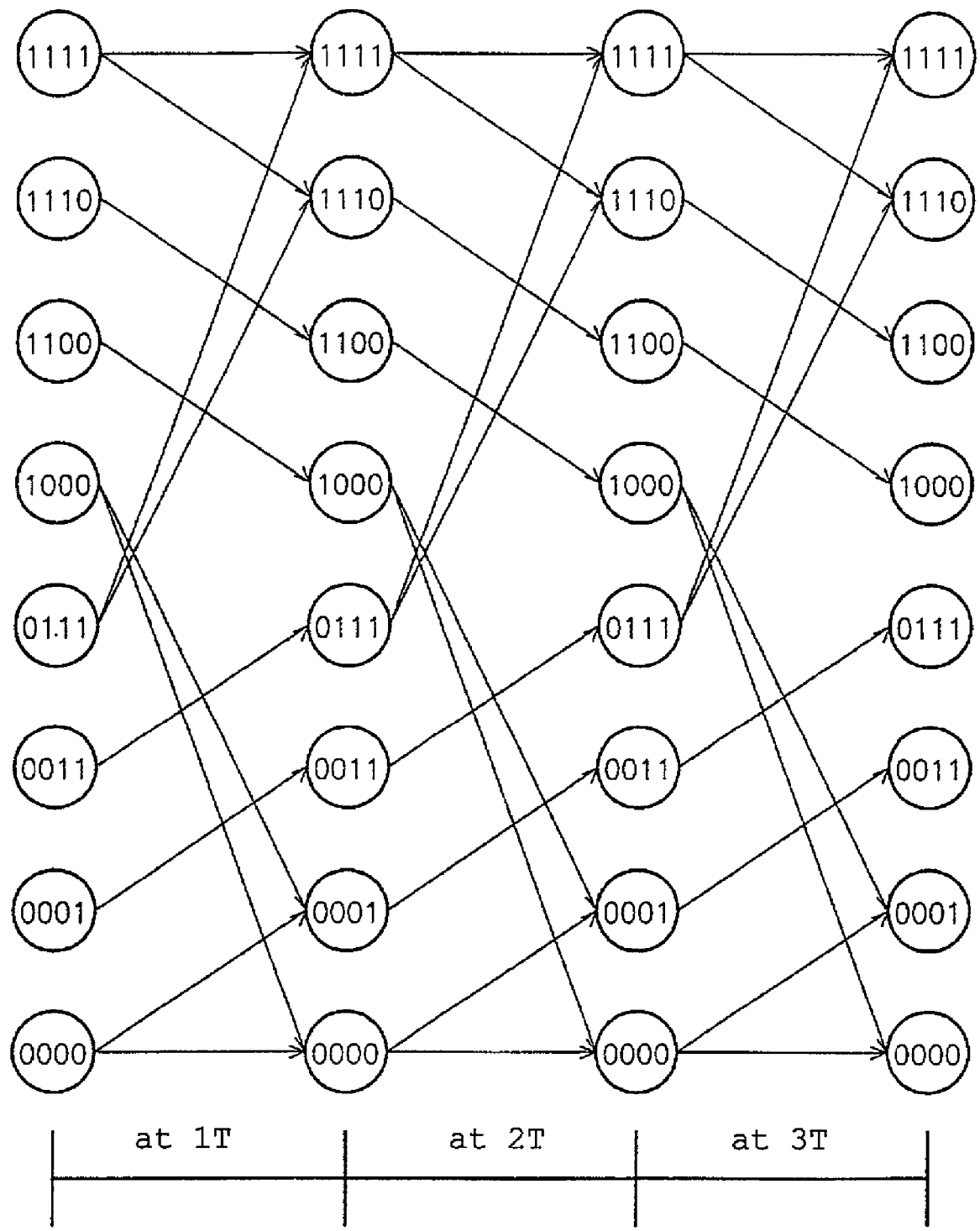
FIG. 12 shows the result after the longitudinal arrangement is performed in FIG. 11.
Figure 13:
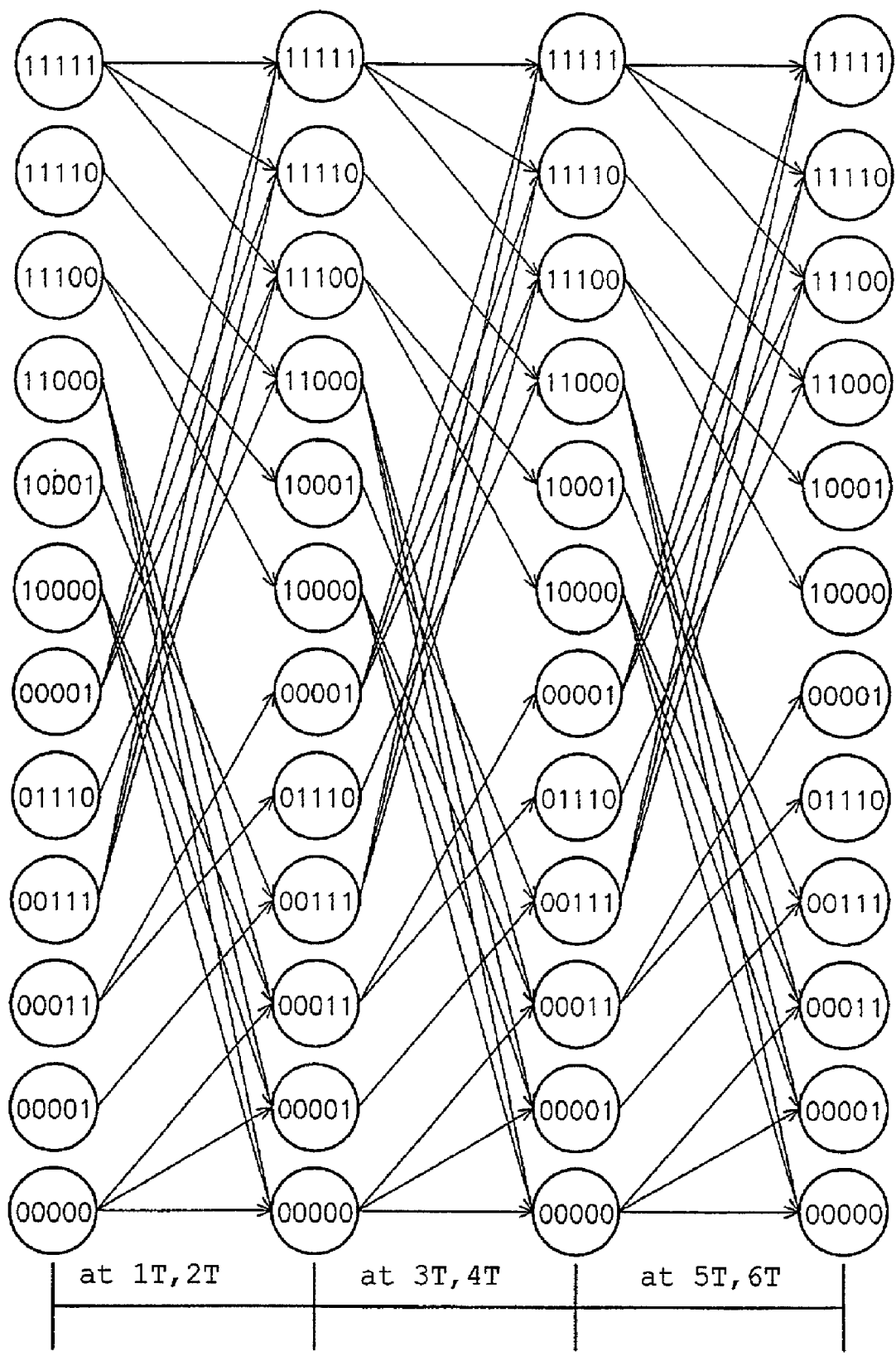
FIG. 13 shows the result after the longitudinal arrangement is performed twice in FIG. 11.

FIG. 10 shows a trellis diagram wherein the number of the channel memory of the binary inputs is 3. As shown in FIG. 10, this channel is quite similar to the commonly used PRML channel. Taking FIG. 11, in which the trellis diagram is shown under the limitation of the RLL (2,10) code, as an example, it is found that the trellis diagram in FIG. 11 is simplified a lot under the limitation of the RLL (2, 10) code in the trellis diagram of FIG. 10. As shown in FIG. 12, which shows the result after the longitudinal arrangement in FIG. 11 is performed, it is found that the number of states of each stage only increases to 2 under the limitation of the RLL (2,10) code and after the longitudinal arrangement of the trellis diagram in FIG. 11. As shown in FIG. 13, which shows the result after the longitudinal arrangement in FIG. 11 is performed twice, it is found that the trellis diagram does not become too complicated but the bottleneck of the ACS has been greatly broadened under the limitation of the RLL (2, 10) code and after two longitudinal arrangements of the trellis diagram in FIG. 11.

Figure 1A:
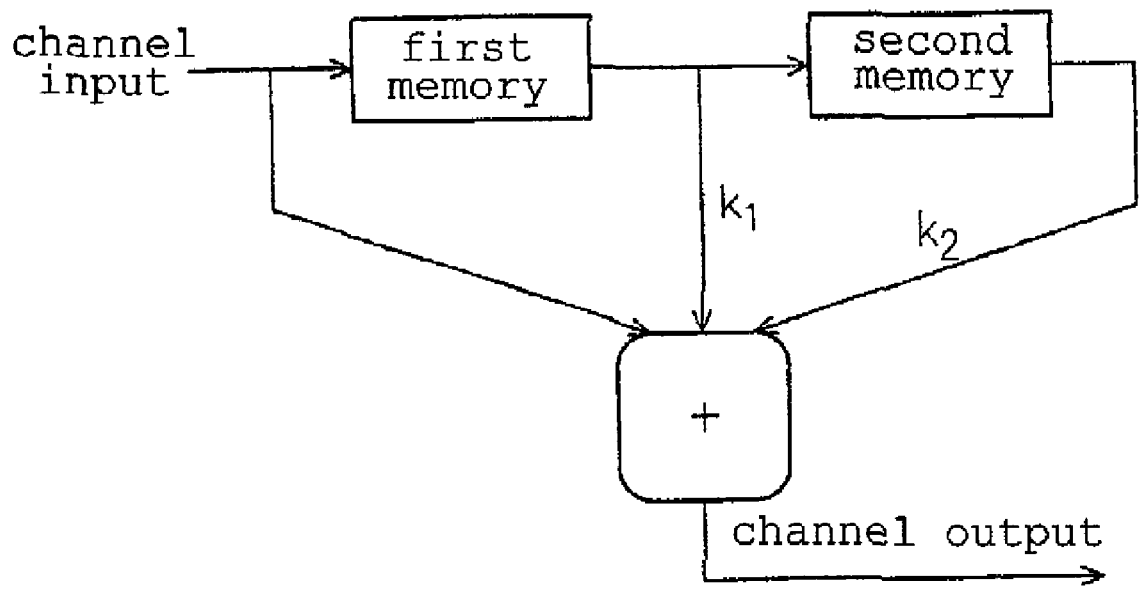
FIG. 1A is a schematic illustration showing a channel model.
Figure 1B:
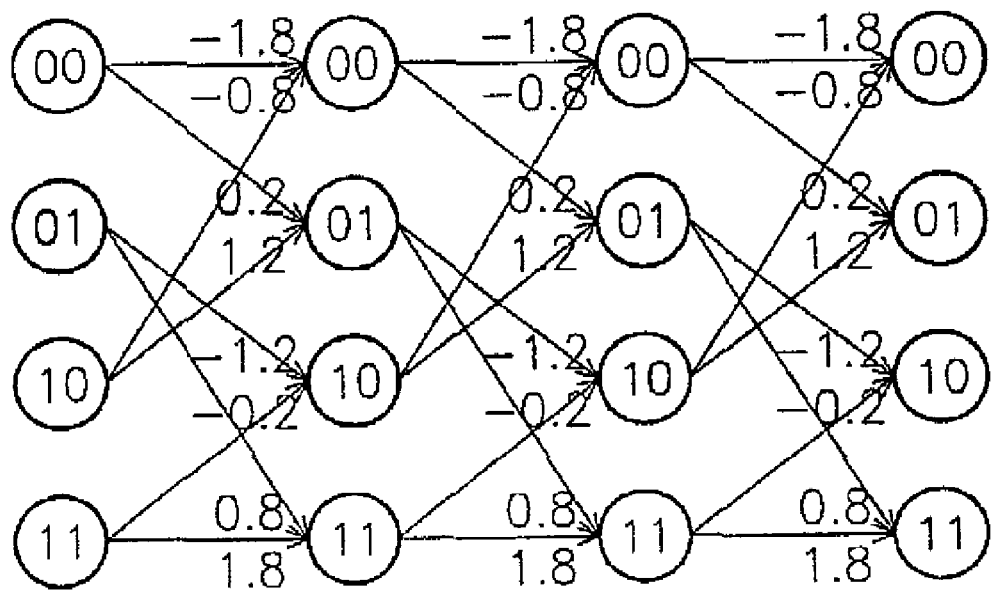
FIG. 1B is a trellis diagram.
Figure 2:
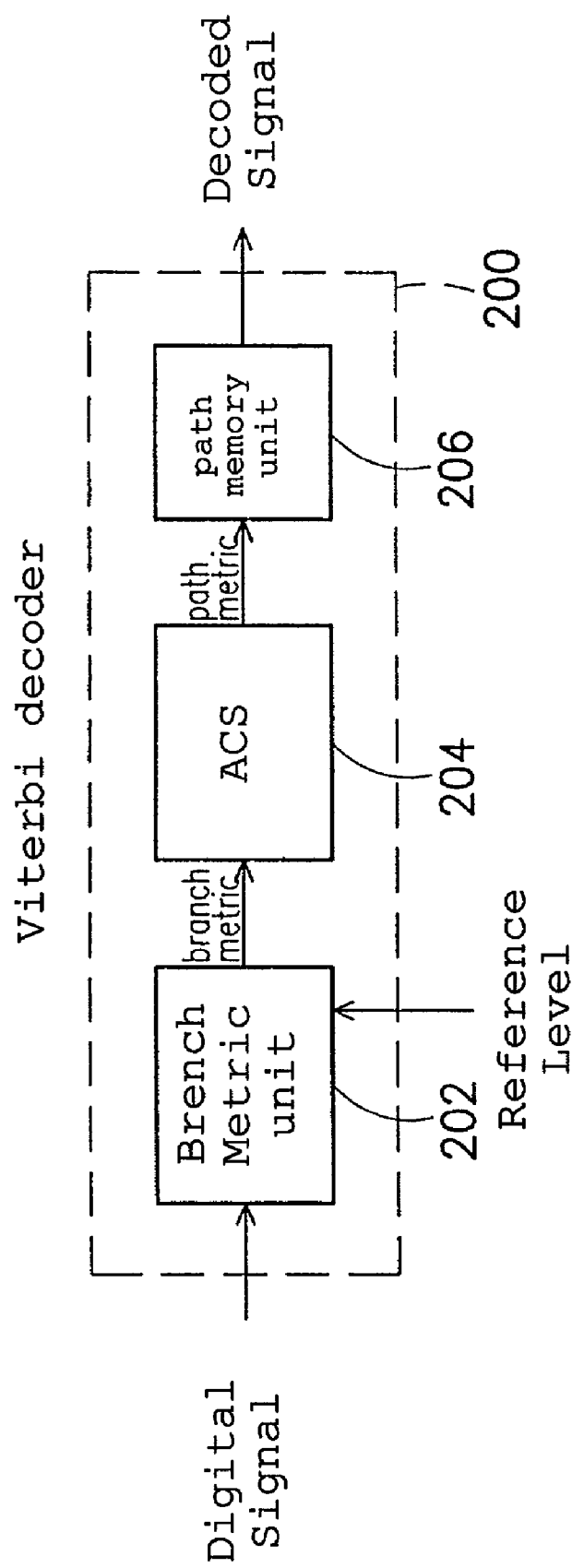
FIG. 2 is a block diagram showing a Viterbi decoder.

Then, as shown in step S76 in FIG. 8, with respect to each branch in the trellis diagram, the Viterbi decoder calculates the branch metric value (performed by the branch metric unit 202 in FIG. 2). Next, the longitudinal arrangement regards the Viterbi decoder as a finite state machine (FSM). It can be known from the property of the finite state machine that:

current output=function(current input, current state)
next state=function(current input, current state)

If the state is re-defined and the current state is regarded as "original current state+original current input", i.e., the original input is merged into the state, the functions becomes that:

current output=function of only the next state
next state=function(current input, current state)

It can be known from FIG. 9C, since the trellis diagram changes its property to the function of "current output=only the function of a nextstate", the bottleneck of the ACS disappears when finding out the survivor path (at this time, the candidate paths cross at the same next state, so their output signals are the same). Because all the branches connected onto this state have the same signal value (because current output=only the function of the next state, and the state is the same), the old path metrics can be compared to determine values of new path metrics when new path metrics (new path metrics old path=branch metric) are calculated.

This operation can be continued to achieve the speed required for any system. For example, the state may be re-defined and expanded once again, and the new current state may be regards as "current state+current input+next input", i.e., the current input and the next input are merged into the state, it becomes:

(current output; next output)=only the function of the next state (step S78 in FIG. 8)
next state=function (next input, current input and current state) (step S80 in FIG. 8)

Similarly, although there are two outputs, it is distinct that the signal values of all the crossed paths in this state are still the same. The above-mentioned method can achieve the effect of a higher speed by the re-expansion of the state, thereby loosening the bottleneck of the ACS.

The trace-back method disclosed in this embodiment is to use the RLL code to find the optimum path of the trellis diagram with respect to the Viterbi algorithm, thereby providing a required management mechanism for the path memory. As described above, the operation principle of the trace-back method is to regularly record the decision bits of each state, and to trace-back the root according to the records. In fact, it is necessary to record the portions that might be confused in the trace-back process (refer to step S82 in FIG. 8).

Figure 14:
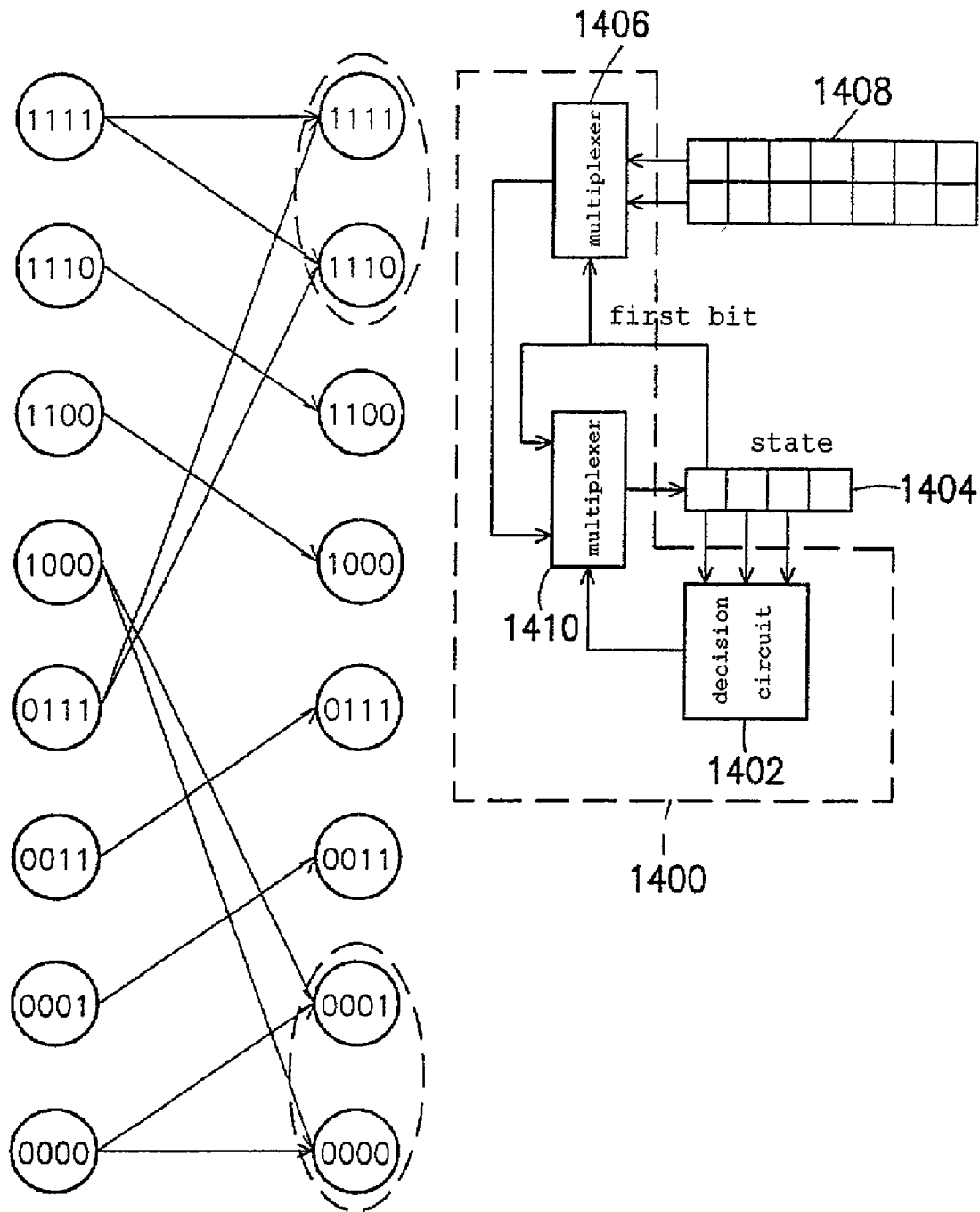
FIG. 14 shows the relationship diagram for solving the trellis diagram by a first trace-back method and the diagram of the state retrieve circuit.

FIG. 14 shows the relationship diagram for solving the trellis diagram by a first trace-back method and the state retrieve circuit. In FIG. 14, under the limitation of the RLL code, some branches disappear with the dissappearance of some states. The remaining states have quite definite interconnection relationships. For example, the state "1000" is definitely from the state "1100". Such inter-connecting lines can be definitely deriviated without being recorded in the trace-back method.

Taking FIG. 14 as an example, instead of eight sets of memories, only two sets of memories are needed for recording the decision bits (write-in (V) operation). When the records are read-back (trace (T), decode (D)), the decision circuit 1402 of the state retrieve circuit 1400 takes the state values of the front three bits of the state 1404 for deciding the relationship between the state value of the current state 1404 and the recorded decision bits (i.e., to decide whether the state value is a legal state value or not) (refer to step S84 in FIG. 8). When the front three bits of the state 1404 is "000" or "111", it means that the decision has to be performed and the trace-back process has to be continued according to the decision bits that are recorded previously (refer to step S86 in FIG. 8). If the first bit of the state 1404 is "1", the multiplexer 1406 selects an upper row of data in the memory block 1408 and outputs them to the multiplexer 1410, and the decision circuit 1402 controls the data output from the multiplexer 1410 to the state 1404. If the first bit of the state 1404 is "0", the multiplexer 1406 selects a bottom row of data in the memory block 1408 and outputs them to the multiplexer 1410, and the decision circuit 1402 controls the data output from the multiplexer 1410 to the state 1404. When the front three bits of the state 1404 are niether "000" nor "111", it is only necessary to extend the first bit of the state 1404. For example, the state value of the first bit of the state 1404 is outputted to the multiplexer 1410, and the decision circuit 1402 controls the data output from the multiplexer 1410 to the state 1404 to generate a state value for a new state 1404.

Figure 15:
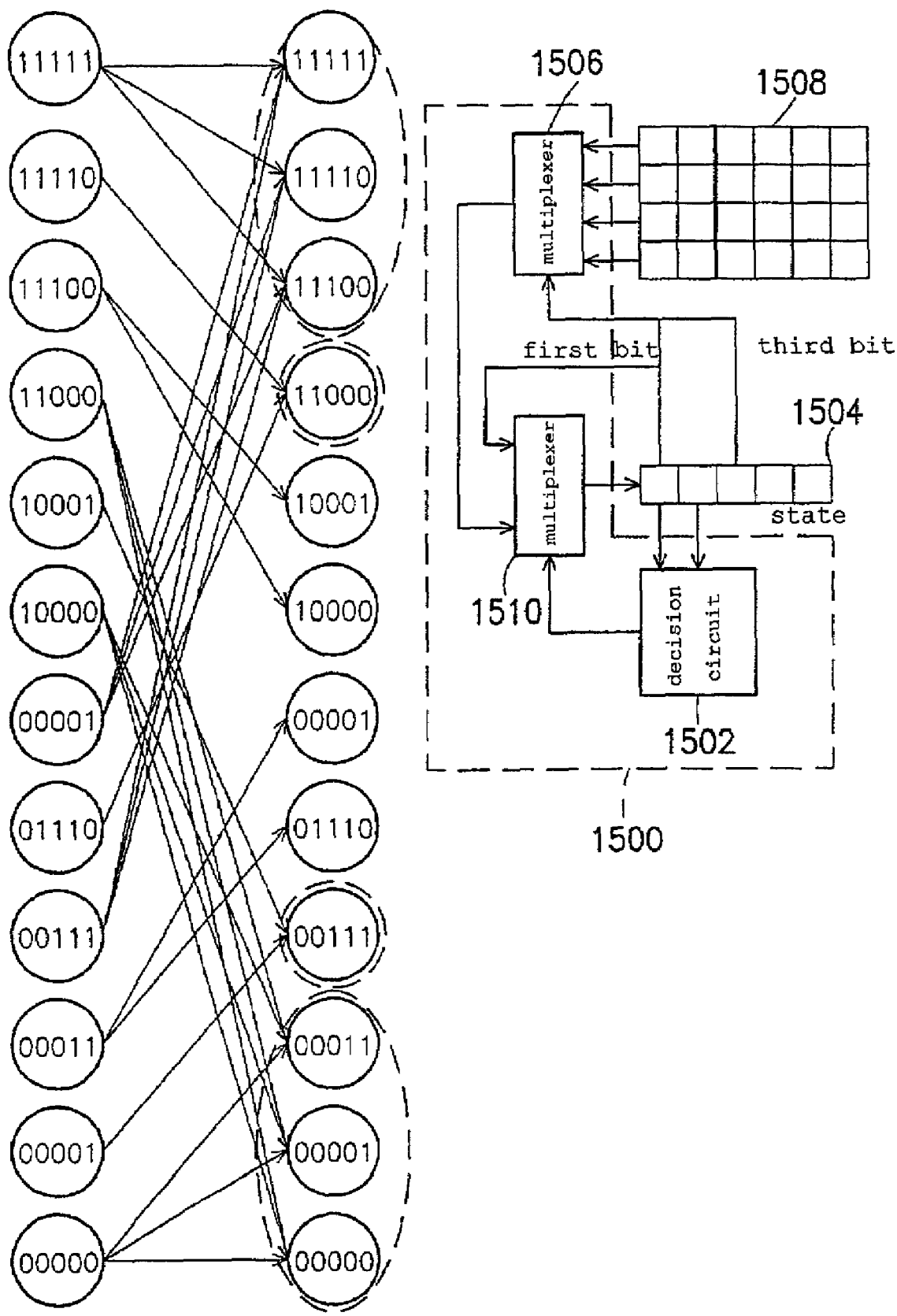
FIG. 15 shows the relationship diagram for solving the trellis diagram by a second trace-back method and the diagram of the state retrieve circuit.
Figure 16:
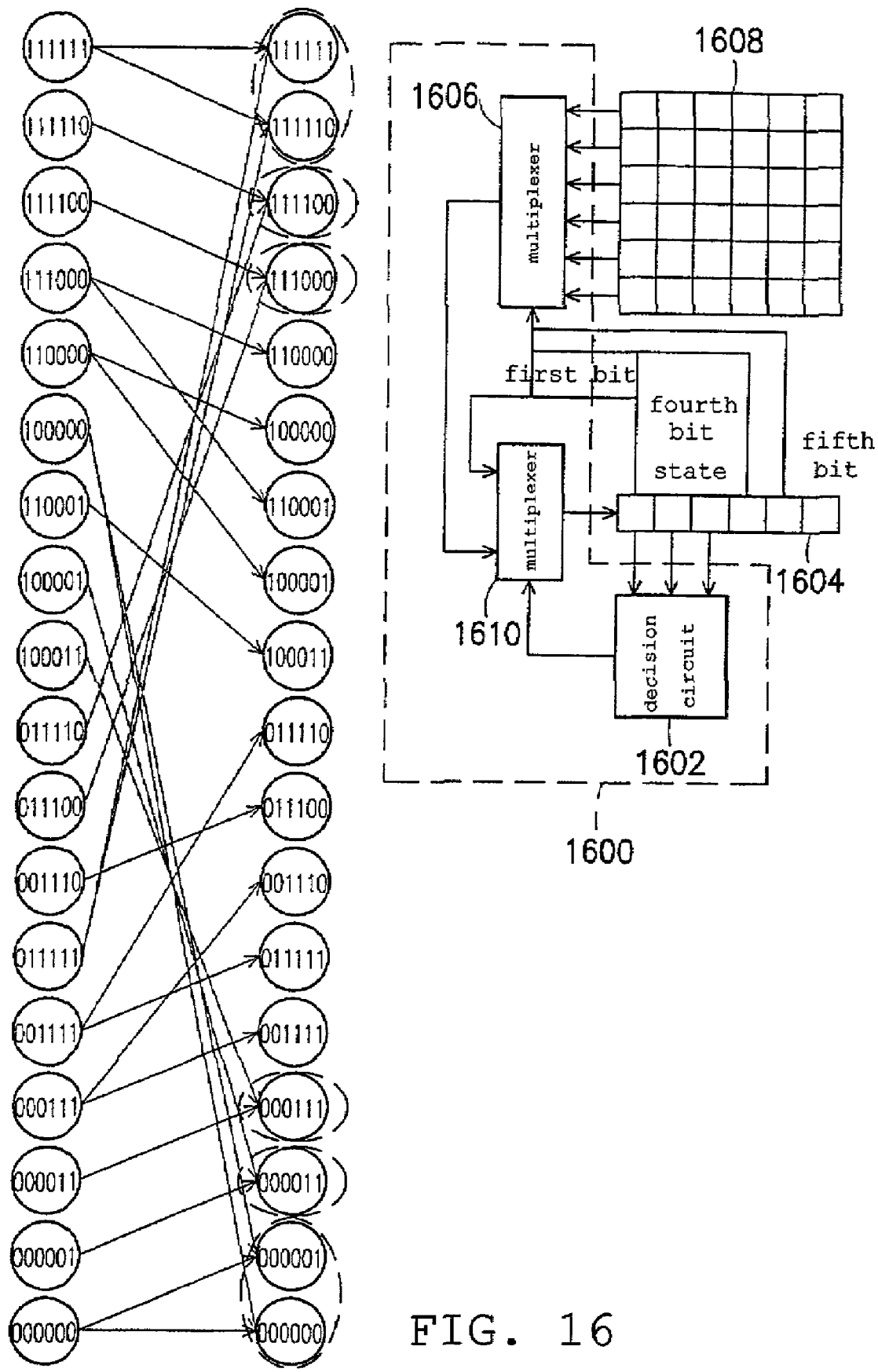
FIG. 16 shows the relationship diagram for solving the trellis diagram by a third trace-back method and the diagram of the state retrieve circuit.

FIG. 15 shows the relationship diagram for solving the trellis diagram by a second trace-back method and the state retrieve circuit. FIG. 16 shows the relationship diagram for solving the trellis diagram by a third trace-back method and the state retrieve circuit. FIGS. 15 and 16 are more complicated trellis diagrams. The operation principles of FIGS. 15 and 16 are briefly described in the following.

In FIG. 15, the decision circuit 1502 of the state retrieve circuit 1500 decides whether the values of the front two bits of the state 1504 are legal or not. It is legal when the front two bits of the state 1504 are "00" or "11". For example, when then the front two bits are legal, the decision circuit 1502 uses the first and third bits of the state 1504 to determine and cause the multiplexer 1506 to select one row of data of the memory block 1508 and to output them to the multiplexer 1510. The decision circuit 1502 also controls the data output from the multiplexer 1510 to the state 1504. It is not legal when the front two bits of the state 1504 are neither "00" nor "11". In this case, the state value of the first bit of the state 1504 is extended twice and is outputted to the multiplexer 1510, and the decision circuit 1502 controls the data output from the multiplexer 1510 to the state 1504 in order to generate a state value of a new state 1504.

Similarly, in FIG. 16, the decision circuit 1602 of the state retrieve circuit 1600 decides whether the state values of the front three bits of the state 1604 are legal or not. It is legal when the front three bits of the state 1604 are "000" or "111". For example, if it is legal, the decision circuit 1602 uses the first, fourth and fifth bits of the state 1604 to determine and cause the multiplexer 1606 to select one row of data of the memory block 1608 and to output them to the multiplexer 1610. The decision circuit 1602 also controls the data output form the multiplexer 1610 to the state 1604. It is not legal when the front three bits of the state 1604 are niether "000" nor "111". In this case, the state value of the first bit of the state 1604 is extended and outputted to the multiplexer 1610, and the decision circuit 1602 controls the data output from the multiplexer 1610 to the state 1604 in order to generate a state value of a new state 1604.

Figure 17A:
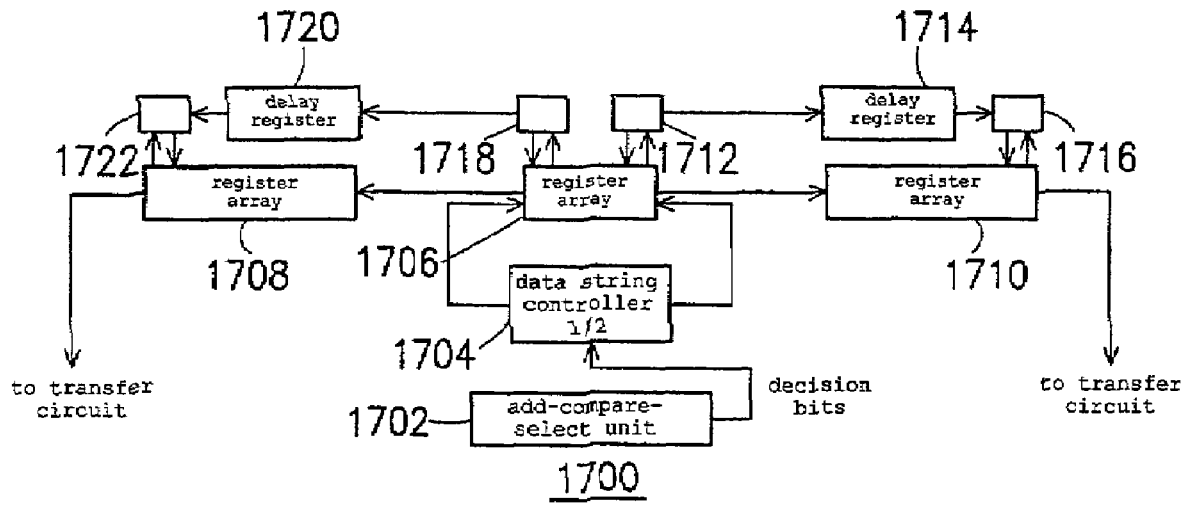
FIG. 17A shows the circuit block diagram of the trace-back method using register arrays.

FIG. 17A shows the circuit block diagram of the trace-back method using register arrays. In FIG. 17A, the trace-back circuit 1700 includes an add-compare-select unit 1702 for computing and finding an optimum path for each state and outputting a decision bit. The data string controller 1704 receives the decision bit outputted from the add-compare-select unit 1702 and decides the direction of the output string of the decision bit. The register array 1706 receives every decision bit outputted from the data string controller 1704, shifts out a pervious decision bit from the register array 1706, and performs a tracing operation to obtain a merged value. The register array 1708 or the register array 1710 waits for the merged value obtained from the tracing operation of the register array 1706 and shifts out the decoded decision bit as a data output.

The state retrieve circuit 1712 and the register array 1706 bidirectionally transmit data to each other. The state retrieve circuit 1712 outputs the data to the delay register 1714. The delay register 1714 receives the data outputted from the state retrieve circuit 1712, delays a period of time, and then outputs the data to the state retrieve circuit 1716. The state retrieve circuit 1716 receives the data outputted from the delay register 1714. The state retrieve circuit 1716 and the register array 1710 bidirectionally transmit data to each other. The state retrieve circuit 1718 and the register array 1706 bidirectionally transmit data to each other. The state retrieve circuit 1718 outputs the data to the delay register 1720. The delay register 1720 receives the data outputted from the state retrieve circuit 1718, delays a period of time, and then outputs the data to the state retrieve circuit 1722. The state retrieve circuit 1722 receives the data outputted from the delay register 1720. Also, the state retrieve circuit 1722 and the register array 1708 bidirectionally transmit data to each other.

Figure 17B:
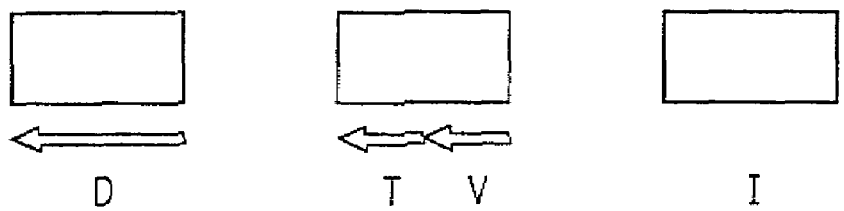
FIG. 17B shows a data string for the trace-back method.

FIG. 17B shows a data string for the trace-back method. In FIG. 17B with reference to FIG. 17A, when the data string controller 1704 controls the data string toward the left-hand side, the register array 1710 is under the conditon of idle (I) while the register array 1708 is under the condition of decode (D). The register array 1708 decodes the data and shifts out the decoded data one by one toward the left-hand side (referring to step S94 in FIG. 8). The register array 1706 writes-in (V) the decision bit data one by one from the left-hand side, and the data shifted out from the register array 1706 is shifted to the register array 1708 toward the left-hand side. When the register array 1708 is full of the shift-in data, the condition of the register array 1708 changes from decode operation (D) to idle operation (I) (referring to step S92 in FIG. 8). At this time, the register array 1706 also performs the operation of trace operation (T) to obtain the root for the next decoding process of the register array 1710 (referring to step S90 in FIG. 8).

Figure 17C:
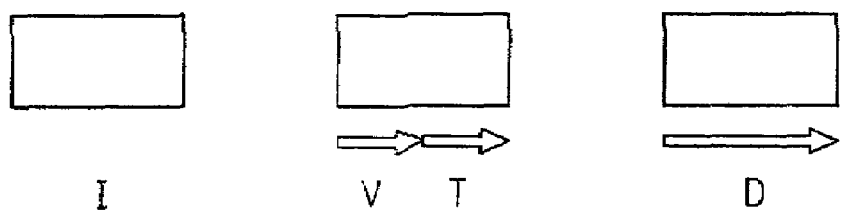

Similarly, FIG. 17C shows another data string for the trace-back method. In FIG. 17C with reference to FIG. 17A, when the data string controller 1704 controls the data string toward the right-hand side, the register array 1708 is under the condition of idle operation (I) while the register array 1710 is under the condition of decode operation (D). The register array 1710 decodes the data and shifts out the decoded data one by one toward the right-hand side (referring to step S94 in FIG. 8). The register array 1706 writes-in (V) the decision bit data one by one from the right-hand side, and the data shifted out from the register array 1706 is shifted to the register array 1718 toward the right-hand side. When the register array 1710 is full of the shift-in data, the condition of the register array 1710 changes from decode operation (D) to idle operation (I) (referring to step S92 in FIG. 8). At this time, the register array 1706 also performs the operation of trace (T) to obtain the root for the next decoding process of the register array 1708 (referring to step S90 in FIG. 8).

Figure 17D:
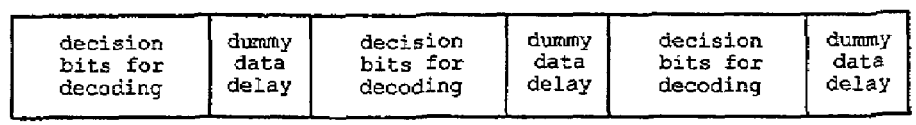
FIG. 17D is a schematic illustration showing that dummy data delays are added to the data string.

FIG. 17D is a schematic illustration showing that dummy data delays are added to the data string. In FIG. 17A, for example, the data is transmitted from the register array 1706 to the register array 1710 via the state retrieve circuit 1712, delay register 1714 and state retrieve circuit 1716. In this case, the phenomenon of data transmission delay may occur. Therefore, the dummy data with a number of bits have to be provided in the register, thereby avoiding data errors of the decoded data due to the transmission delay.

Consequently, the advantage of the invention is that a decoding circuit and a method for a Viterbi decoder is provided. In this invention, a run length limited code is used for effectively solving the problem of generating a complicated trellis diagram after the trellis diagram of the Viterbi decoder is subjected to a longitudinal arrangement. Therefore, the ACS can perform adding and comparing operations in parallel, and the register array can perform other operations at different time. Accordingly, a high decoding speed of the Viterbi decoder can be achieved without requiring a lot of registers for data processing in the ACS and PMU.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A decoding method of a Viterbi decoder, the Viterbi decoder having a branch metric unit, an add-compare-select unit and a path memory unit, the method comprising the steps of:

performing a longitudinal arrangement with respect to a trellis diagram corresponding to the Viterbi decoder so as to obtain a longitudinal arrangement trellis diagram;

processing the longitudinal arrangement trellis diagram according to a run length limited (RLL) code so as to obtain a RLL trellis diagram;

computing a current input branch-metric value by the branch metric unit according to the RLL trellis diagram;

obtaining a next state value by computing the current input branch-metric value, a next input branch-metric value and a current state by the add-compare-select unit so as to obtain a next state value;

recording results computed by the add-compare-select unit in the path memory unit so as to obtain a survivor path; and decoding the recorded survivor path.

2. The decoding method according to claim 1, further comprising the step of creating the trellis diagram corresponding to the Viterbi decoder before the step of performing the longitudinal arrangement.

3. The decoding method according to claim 2, wherein the step of performing the longitudinal arrangement is performed several times.

4. The decoding method according to claim 3, wherein the step of obtaining a next state value sets a current output decision bit and a next output decision bit according to only the next state value.

5. The decoding method according to claim 4, wherein the branch metric value computed according to the RLL trellis diagram is inputted into the add-compare-select unit so as to become one of the current input branch-metric value and the next input branch-metric value.

6. The decoding method according to claim 5, wherein the method for recording the survivor path in the path memory unit is one of a shuffle-exchange method and a trace-back method.

7. The decoding method according to claim 6, wherein a set of memory is provided for each state of the trellis diagram corresponding to the Viterbi decoder in the shuffle-exchange method so as to record the survivor path reaching the state value.

8. The decoding method according to claim 6, wherein the trace-back method comprises the steps of:
   recording a decision bit of a previous state value and the current state value according to the current output decision bit and the next output decision bit;
   comparing the relationship between the current state value and the decision bit;
   writing the decision bit into the suitable state value;
   writing an extension bit, which is the same as a first bit of the state value, into the state when the state of the decision bit is not recorded;
   outputting the decision bit to a trace write-in register array and tracing for obtaining a merged value, wherein the decoding register array becomes an idling register array when the decision bit stored in a decoding register array reaches a predetermined amount; and
   decoding the decision bit stored in the previous idling register array according to the merged value.

9. A decoding method of a Viterbi decoder, the Viterbi decoder having a branch metric unit, an add-compare-select unit and a path memory unit having a decoding register array, a trace write-in register array and an idling register array, the method comprising the steps of:
   creating a original trellis diagram corresponding to the Viterbi decoder;
   performing a longitudinal arrangement with respect to the original trellis diagram so as to obtain a longitudinal arrangement trellis diagram;
   processing the longitudinal arrangement trellis diagram according to a RLL code so as to obtain a RLL trellis diagram;
   computing a branch metric value by the branch metric unit according to the RLL trellis diagram;
   computing a current input branch-metric value, a next input branch-metric value and a current state by the add-compare-select unit so as to obtain a next state value;
   setting a current output decision bit and a next output decision bit by the add-compare-select unit according to only the next state value;
   recording a decision bit on a previous state value and the current state value according to the current output decision bit and the next output decision bit;
   comparing a relationship between the current state value and the decision bit;
   writing the decision bit into the suitable state value;
   outputting the decision bit from the add-compare-select unit to the trace write-in register array and tracing for obtaining a merged value, wherein the decoding register array becomes the idling register array when the decision bit stored in the decoding register array reaches a predetermined amount; and
   decoding the decision bit stored in the previous idling register array according to the merged value.

10. The decoding method according to claim 9, wherein the step of performing the longitudinal arrangement with respect to the original trellis diagram is performed several times.

11. The decoding method according to claim 10, wherein the branch metric value computed according to the RLL trellis diagram is inputted into the add-compare-select unit so as to become one of the current input branch-metric-value and the next input branch-metric-value.

12. A decoding circuit of a Viterbi decoder, the decoding circuit comprising a branch metric unit, an add-compare-select unit and a path memory unit, the branch metric unit computing a branch metric value and outputting the branch metric value to the add-compare-select unit, the add-compare-select unit computing an optimum path of a state value according to the branch metric value and outputting a decision bit, the path memory unit comprising:
   a data string controller for receiving the decision bit outputted from the add-compare-select unit and deciding the direction of the output string of the decision bit;
   a trace write-in register array for receiving the decision bit outputted from the data string controller and tracing to obtain a merged value;
   an idling register array for storing the merged value obtained from the tracing of the trace write-in register array; and
   a decoding register array for decoding the decision bit stored in the decoding register array according to the merged value obtained by the tracing.

13. The decoding circuit according to claim 12, wherein the decoding register array becomes the idling register array when the decision bit stored in the decoding register array reaches a predetermined amount.

14. The decoding circuit according to claim 13, wherein when the trace write-in register array traces and obtains the merged value and provides the merged value to the idling register array, the idling register array becomes the decoding register array and decodes acccording to the merged value.

15. The decoding circuit according to claim 14, further comprising, between the trace write-in register array and the idling register array:
   a first state retrieve circuit performing bidirectional data transmission with the trace write-in register array and capable of outputting data;
   a first delay register for receiving the data outputted from the first state retrieve circuit, delaying a period of time, and then outputting the data; and
   a second state retrieve circuit for receiving the data outputted from the first delay register and perfomring bidirectional data transmission with the idling register array.

16. The decoding circuit according to claim 15, further comprising, between the trace write-in register array and the decoding register array:
   a third state retrieve circuit performing bidirectional data transmission with the trace write-in register array and capable of outputting data;
   a second delay register for receiving the data outputted from the third state retrieve circuit, delaying a period of time, and then outputting the data; and
   a fourth state retrieve circuit for receiving the data sent by the second delay register, and performing bidirectional data transmission with the decoding register array.

17. The decoding circuit according to claim 16, wherein data access is performed between the first state retrieve circuit and a memory block and a state register of the register array, and the first state retrieve circuit further comprises:
   a first decision circuit having a plurality of decision signal input terminals for receiving output data from the state register, and having a selection signal output terminal for outputting a selection signal;
   a first multiplexer having a plurality of input terminals for receiving data of the memory block, a selection terminal for receiving data of the state register, and an output terminal for outputting data; and a second multiplexer having input terminals for receiving output data from the state register and the output terminal of the first multiplexer, a selection terminal for receiving the selection signal outputted from the selection signal output terminal of the first decision circuit, and a output terminal for outputting data to the state register.

18. The decoding circuit according to claim 16, wherein data access is performed between the second state retrieve circuit and the memory block and the state register of the register array, and the second state retrieve circuit further comprises:

a second decision circuit having the plurality of decision signal input terminals for receiving output data from the state register, and having the selection signal output terminal for outputting the selection signal;

a third multiplexer having a plurality of input terminals for receiving data of the memory block, a selection terminal for receiving data of the state register, and a output terminal for outputting data; and a fourth multiplexer having input terminals for receiving output data from the state register and the output terminal of the third multiplexer, a selection terminal for receiving the selection signal outputted from the selection signal output terminal of the second decision circuit, and a output terminal for outputting data to the state register.

19. The decoding circuit according to claim 16, wherein data access is performed between the third state retrieve circuit and the memory block and the state register of the register array, and the third state retrieve circuit further comprises:

a third decision circuit having a plurality of decide signal input terminals for receiving output data from the state register, and having the selection signal output terminal for outputting the selection signal;

a fifth multiplexer having a plurality of input terminals for receiving data of the memory block, a selection terminal for receiving data of the state register, and a output terminal for outputting data; and a sixth multiplexer having input terminals for receiving output data from the state register and the output terminal of the fifth multiplexer, a selection terminal for receiving the selection signal outputted from the selection signal output terminal of the third decision circuit, and a output terminal for outputting data to the state register.

20. The decoding circuit according to claim 16, wherein data access is performed between the fourth state retrieve circuit and the memory block and the state register of the register array, and the fourth state retrieve circuit further comprises:

a fourth decision circuit having a plurality of decide signal input terminals for receiving output data from the state register, and having the selection signal output terminal for outputting the selection signal;

a seventh multiplexer having the plurality of input terminals for receiving data of the memory block, the selection terminal for receiving data of the state register, and a output terminal for outputting data; and an eighth multiplexer having input terminals for receiving output data from the state register and the output terminal of the seventh multiplexer, the selection terminal for receiving a selection signal outputted from the selection signal output terminal of the fourth decision circuit, and a output terminal for outputting data to the state register.

* * * * *